United States Patent [19]
DeBoer et al.

[11] Patent Number: 5,491,046
[45] Date of Patent: Feb. 13, 1996

[54] METHOD OF IMAGING A LITHOGRAPHIC PRINTING PLATE

[75] Inventors: Charles D. DeBoer, Rochester; Neil F. Haley, Wellington, both of N.Y.

[73] Assignee: Eastman Kodak Company, Rochester, N.Y.

[21] Appl. No.: 386,839

[22] Filed: Feb. 10, 1995

[51] Int. Cl.$^6$ .............................. G03F 7/038; G03F 7/20; G03F 7/30; G03F 7/38

[52] U.S. Cl. .................... 430/302; 430/270.14; 430/944; 430/309

[58] Field of Search ...................... 430/270, 944, 430/302, 309

[56] References Cited

U.S. PATENT DOCUMENTS

| | | | |
|---|---|---|---|
| 4,189,323 | 2/1980 | Buhr | 430/281 |
| 4,708,925 | 11/1987 | Newman | 430/270 |
| 4,731,317 | 3/1988 | Fromson | 430/159 |
| 4,927,741 | 5/1990 | Garth et al. | 430/309 |
| 5,019,481 | 5/1991 | Ito | 430/270 |
| 5,339,737 | 8/1994 | Lewis et al. | 430/302 |
| 5,340,699 | 8/1994 | Haley et al. | 430/270 X |
| 5,351,617 | 10/1994 | Williams et al. | 101/457 |
| 5,372,907 | 12/1994 | Haley et al. | 430/157 |
| 5,372,915 | 12/1994 | Haley et al. | 430/302 |

FOREIGN PATENT DOCUMENTS

| | | | |
|---|---|---|---|
| 2082339 | 3/1982 | United Kingdom | 430/302 |

OTHER PUBLICATIONS

W. S. DeForest, *Photoresist: Materials and Processes* McGraw—Hill Book Company, New York, NY, 1975, pp. 109–124.

*Primary Examiner*—Cynthia Hamilton
*Attorney, Agent, or Firm*—Alfred P. Lorenzo

[57] ABSTRACT

A lithographic printing plate that has an imaging layer that comprises an admixture of (1) a resole resin, (2) a novolac resin, (3) a latent Bronsted acid and (4) an infrared absorber; that is sensitive to both ultraviolet and infrared radiation; and that is capable of functioning in either a positive-working or negative-working manner is imagewise exposed with a laser diode that emits a high-intensity infrared laser beam which provides enhanced image sharpness.

20 Claims, No Drawings

METHOD OF IMAGING A LITHOGRAPHIC PRINTING PLATE

FIELD OF THE INVENTION

This invention relates in general to lithographic printing plates and in particular to lithographic printing plates which can be employed as either a positive-working plate or a negative-working plate. More specifically, this invention relates to imaging of the aforesaid printing plates by an improved method which provides improved performance in terms of image sharpness, reliability and ease of operation.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced; such as paper, cloth and the like. Commonly the ink is transferred to an intermediate material called the blanket which in turn transfers the ink to the surface of the material upon which the image is to be reproduced.

A very widely used type of lithographic printing plate has a light-sensitive coating applied to an aluminum base support. The coating may respond to light by having the portion which is exposed become soluble so that it is removed in the developing process. Such a plate is referred to as positive-working. Conversely, when that portion of the coating which is exposed becomes hardened, the plate is referred to as negative-working. In both instances the image area remaining is ink-receptive or oleophilic and the non-image area or background is water-receptive or hydrophilic. The differentiation between image and non-image areas is made in the exposure process where a film is applied to the plate with a vacuum to insure good contact. The plate is then exposed to a light source, a portion of which is composed of UV radiation. In the instance where a positive plate is used, the area on the film that corresponds to the image on the plate is opaque so that no light will strike the plate, whereas the area on the film that corresponds to the non-image area is clear and permits the transmission of light to the coating which then becomes more soluble and is removed. In the case of a negative plate the converse is true. The area on the film corresponding to the image area is clear while the non-image area is opaque. The coating under the clear area of film is hardened by the action of light while the area not struck by light is removed. The light-hardened surface of a negative plate is therefore oleophilic and will accept ink while the non-image area which has had the coating removed through the action of a developer is desensitized and is therefore hydrophilic.

The manufacture of a printing plate which can be employed as either a positive-working plate or a negative-working plate has long been known. Such a plate has the advantage of increased versatility since either positive or negative originals can be used.

One example of a printing plate which can be employed as either a positive-working plate or a negative-working plate is that described in British Patent No. 2,082,339, published Mar. 3, 1982 and in U.S. Pat. No. 4,927,741, issued May 22, 1990. These patents describe a lithographic printing plate in which the imaging layer comprises a resole resin and an orthoquinone diazide and, optionally, also contains a novolac resin. Such a plate can be used as a positive-working plate by a process comprising the steps of imagewise exposure and development with an aqueous alkaline developing solution to remove the coating from the exposed areas. Alternatively, it can be used as a negative-working plate by a process comprising the steps of imagewise exposure, heating of the plate to convert the coating in the exposed areas to an insoluble form, overall exposure of the plate to radiation to render previously unexposed areas soluble, and development with an aqueous alkaline developing solution to remove such soluble areas.

A further example of a printing plate which can be employed as either a positive-working plate or a negative-working plate is that described in U.S. Pat. No. 4,708,925, issued Nov. 24, 1987. This patent describes a lithographic printing plate in which the imaging layer comprises a phenolic resin and a radiation-sensitive onium salt. As described in the patent, the interaction of the phenolic resin and the onium salt produces an alkali-insoluble composition which is restored to alkali-solubility upon photolyric decomposition of the onium salt. The printing plate can be utilized as a positive-working plate or as a negative-working plate using the same process steps as are described hereinabove in regard to the plates of British Patent 2,082,339 and U.S. Pat. No. 4,927,741.

The radiation-sensitive composition described in U.S. Pat. No. 4,708,925 is useful for the preparation of a direct laser addressable plate. Digital imaging information can be used to image the plate without the need to utilize an imaging master such as a photographic transparency.

The hereinabove described printing plates of the prior art which can be employed as either a positive-working plate or a negative-working plate are lacking in one or more desirable features. Thus, the plates described in British Patent No. 2,082,339 are not infrared-sensitive and thus cannot be digitally imaged by a laser which emits in the infrared region. Moreover, both the plates of British Patent No. 2,082,339 and U.S. Pat. No. 4,708,925 require two exposure steps in order to be utilized as a negative-working plate, i.e., an imagewise exposure and a subsequent overall exposure. This adds greatly to the cost and complexity of the process. The difficulties of carrying out a process requiring multiple exposure steps, while meeting the requirements of the trade for high speed processing, are described in U.S. Pat. No. 4,927,741.

Radiation-sensitive compositions comprised of (1) a resole resin, (2) a novolac resin, (3) a latent Bronsted acid and (4) an infrared absorber are described in Haley et al, U.S. Pat. No. 5,372,907, issued Dec. 13, 1994.

Radiation-sensitive compositions comprised of (1) a resole resin, (2) a novolac resin, (3) a latent Bronsted acid and (4) an infrared absorber and which are characterized in that the latent Bronsted acid is a haloalkyl-substituted s-triazine are described in copending commonly assigned U.S. patent application Ser. No. 212,434, filed Mar. 14, 1994, "Radiation-Sensitive Composition Containing A Resole Resin, A Novolac Resin, An Infrared Absorber And A Triazine And Use Thereof In Lithographic Printing Plates" by Neil F. Haley and Steven L. Corbiere.

Radiation-sensitive compositions comprised of (1) a resole resin, (2) a novolac resin, (3) a latent Bronsted acid, (4) an infrared absorber, and (5) terephthalaldehyde are described in copending commonly assigned U.S. patent application Ser. No. 298,472, filed Aug. 29, 1994, "Radiation-Sensitive Composition Containing A Resole Resin, A Novolac Resin, A Latent Bronsted Acid, An Infrared Absorber And Terephthalaldehyde And Use Thereof In Lithographic Printing Plates" by Neil F. Haley and Steven L. Corbiere.

The compositions of U.S. Pat. No. 5,372,907, and of copending patent applications Ser. Nos. 212,434 and 298,472 are useful in preparing a lithographic printing plate which can be employed as either a positive-working plate or a negative-working plate. To utilize these lithographic printing plates as a positive-working plate requires that they be imagewise exposed to activating radiation, thereby rendering the exposed areas alkali-soluble, and contacted with an aqueous alkaline developing solution to remove the exposed areas. To utilize them as a negative-working plate requires the steps of imagewise exposure to activating radiation, heating of the plate to provide reduced solubility in exposed areas and increased solubility in unexposed areas, and contact with an aqueous alkaline processing solution to remove the unexposed areas. In contrast with the printing plates of British Patent No. 2,082,339 and U.S. Pat. No. 4,708,925, use of both a resole resin and a novolac resin is essential and the use of two exposure steps is not necessary.

While the radiation-sensitive compositions of U.S. Pat. No. 5,372,907, U.S. patent application Ser. No. 212,434 and U.S. patent application Ser. No. 298,472 represent a major advance in the art, they would benefit from an improved method for imaging thereof, especially from an improved method providing enhanced image sharpness. It is toward the objective of providing such improved method that the present invention is directed.

SUMMARY OF THE INVENTION

The present invention provides an improved method for the imaging of a lithographic printing plate. The improved method comprises the steps of:

(I) providing a lithographic printing plate comprising a support and an imaging layer that is sensitive to both ultraviolet and infrared radiation and capable of functioning in either a positive-working or negative-working manner, the imaging layer comprising an admixture of (1) a resole resin, (2) a novolac resin, (3) a latent Bronsted acid and (4) an infrared absorber; and (II) imagewise exposing the imaging layer with a high-intensity laser diode emitting an infrared laser beam with an intensity at the surface of the imaging layer of at least about 0.2 milliwatts per square micrometer.

Use, in accordance with this invention, of a high-intensity laser diode that emits in the infrared region of the spectrum and of an infrared laser beam with the aforesaid high intensity at the surface of the imaging layer of at least about 0.2 milliwatts per square micrometer, and more preferably at least about 0.4 milliwatts per square micrometer, provides many advantages. For example, such laser diodes are inexpensive, highly reliable and easy to utilize and by virtue of the high intensity of the laser beam they provide greatly enhanced image sharpness.

The characteristics of the printing plates described herein are such that imagewise exposure to the infrared laser beam followed by heating results in opposite effects in exposed and unexposed areas. In particular, in exposed areas the imaging layer becomes less soluble in an aqueous alkaline developing solution while in unexposed areas it becomes more soluble in such solution. These opposing effects contribute to both high speed and high contrast, both of which are highly desirable attributes in a lithographic printing plate.

Since the printing plate of this invention is infrared sensitive, digital imaging information can be conveniently utilized to form continuous or halftone images using the aforesaid high-intensity laser diode. Since the printing plate of this invention is also ultraviolet sensitive, it can also be conveniently imaged so as to form continuous or halftone images by ultraviolet exposure through a suitable imaging master such as a silver halide film. Because of these characteristics, the same plate can be utilized in equipment intended for input of electronic data by writing with the infrared laser or in the type of equipment that is commonly employed to carry out ultraviolet exposure of lithographic printing plates. It is thus an easy matter to combine digital or electronic imaging techniques with conventional optical imaging techniques, i.e., to use both types of imaging with the same printing plate. Accordingly, information not available in an electronic format can be added by optical imaging techniques to complete the imaging of the lithographic printing plate when it is desired to do so.

To utilize the lithographic printing plate of this invention as a positive-working plate requires that it be imagewise exposed to the high-intensity infrared radiation, thereby rendering the exposed areas alkali-soluble, and contacted with an aqueous alkaline developing solution to remove the exposed areas. To utilize it as a negative-working plate requires the steps of imagewise exposure to the high-intensity infrared radiation, heating of the plate to provide reduced solubility in exposed areas and increased solubility in unexposed areas, and contact with an aqueous alkaline processing solution to remove the unexposed areas. In contrast with the printing plates of British Patent No. 2,082,339 and U.S. Pat. No. 4,708,925, use of both a resole resin and a novolac resin is essential in the present invention and the use of two exposure steps is not necessary.

Functioning of the printing plates described herein is believed to be based upon an acid-catalyzed chemical amplification mechanism which occurs upon heating of the exposed plate. This mechanism reduces the solubility of the exposed areas by hardening the mixture of resins. At the same time, it increases the solubility of the unexposed areas. The mechanism whereby it accomplishes the latter effect is not clearly understood.

The functioning of the plate as a negative-working plate is critically dependent upon the use of a mixture of a resole resin and a novolac resin since the use of either resin alone does not provide a useful developed image.

Exposure of the plate to infrared radiation is believed to decompose both the infrared absorber and the latent Bronsted acid in the exposed areas. The decomposition products are believed to catalyze a reaction between the resole resin and the novolac resin to form a matrix which after heating is insoluble in aqueous alkaline developing solution.

Exposure to ultraviolet radiation also results in decomposition of the latent Bronsted acid to generate a Bronsted acid which catalyzes the matrix-forming reaction between the resole resin and the novolac resin. The plate has a high degree of sensitivity in both the ultraviolet and infrared regions of the spectrum. In other words, it can be exposed at two different wavelengths.

DESCRIPTION OF THE PREFERRED EMBODIMENTS

As indicated hereinabove, the imaging layer of the printing plates utilized in this invention is comprised of (1) a resole resin, (2) a novolac resin, (3) a latent Bronsted acid, and (4) an infrared absorber. The present invention requires the use of laser diodes to image this layer which both emit in the infrared and provide the required high intensity of the laser beam. In contrast with devices such as argon-ion lasers which are expensive, cumbersome to use and require regular maintenance, infrared laser diodes are inexpensive, highly reliable and easy to operate. Any of the known infrared laser diode devices can be used in this invention provided they meet the intensity requirements specified herein.

The imaging layer utilized in the present invention is uniquely adapted for "direct-to-plate" imaging. Direct-to-plate systems utilize digitized image information, as stored on a computer disk or a computer tape, which is intended to be printed. The bits of information in a digitized record correspond to the image elements or pixels of the image to be printed. This pixel record is used to control an exposure device which may, for example, take the form of a modulated laser beam. The position of the exposure beam, in turn, may be controlled by a rotating drum, a leadscrew, or a turning mirror (flying spot apparatus). The exposure beam is turned on and off in correspondence with the pixels to be printed. The exposing beam is focused onto a presensitized, unexposed, lithographic printing plate. The so-exposed plate is submitted to any required processing steps, such as removal of unexposed material, washing, etc., to produce a lithographic printing plate ready for the printing press.

The direct-to-plate method of plate making is contrasted with the conventional method which involves use of an exposed and processed film of the image to be printed; which film is then contact printed with ultraviolet radiation onto the sensitized, unexposed printing plate, followed by the required plate processing procedures. The direct-to-plate method of directly imaging a lithographic plate does not require the use of any film and, thus, contributes to savings in film cost and processing.

The present invention provides a method for imaging lithographic printing plates utilizing a high-intensity laser diode writing source. Plates prepared in accordance with this invention do not require any silver halide film separations. Specifically, a laser printing apparatus is provided that includes a mechanism for scanning the write beam across the plate to generate an image. The intensity of the write beam generated by the laser diode source at the plate is at least about 0.2 milliwatts per square micrometer (mW/$\mu$m$^2$). During operation, the plate to be exposed is placed in the retaining mechanism of the writing device and the write beam is scanned across the plate to generate an image.

The invention is based, in part, on the discovery that the minimum exposure on the plate needed to provide good lithographic printing performance is a function of the intensity of the laser beam focused on the plate. If a low power lens is used that writes a large area laser spot, the intensity of the beam will be low (for a given laser diode power). A high power lens that writes a small area spot will give a high intensity beam. A low-intensity beam may not supply enough energy per unit area to raise the temperature of the imaging layer high enough to effect the desired reactions. The limitation on temperature rise stems from the natural thermal conductivity of the surrounding area which, in this case, is the supporting layer for the lithographic printing layer. At the maximum temperature for a given laser intensity, the heat generated by the laser must equal the heat being conducted away from the exposed area. At very low laser intensities, the temperature rise in the imaging layer may be only a few degrees above ambient. At high laser intensities such as are employed herein, the temperature is rapidly increased to the level necessary to effect the desired physical and chemical changes.

As hereinabove described, the present invention requires the use of both a resole resin and a novolac resin. Resole resins are well known and widely available on a commercial basis. They are phenolic resins which are obtained by reaction of phenolic compounds with aldehydes. A typical example of a resole resin useful in this invention is a resin prepared from bis-phenol A and formaldehyde. A preferred resole resin that is available on a commercial basis is UCAR phenolic resin BKS-5928 which is available from Georgia Pacific Corporation. Novolac resins are also well known and widely used on a commercial basis. They are phenolic resins which are also obtained by reaction of phenolic compounds with aldehydes but under different reaction conditions than those that produce resole resins. A typical example of a novolac resin useful in this invention is a resin prepared from m-cresol and formaldehyde. A preferred novolac resin that is available on a commercial basis is N-9P NOVOLAK available from Eastman Kodak Company.

Differences between resole resins and novolac resins and the processes used in their preparation are described in U.S. Pat. No. 4,708,925 and in British Patent No. 2,082,339. The resole resins and the novolac resins specifically described in these patents are also useful in the present invention, but the invention requires the use of both a resole resin and a novolac resin, whereas use of both resins is not required in either of these patents.

The radiation-sensitive composition of this invention must contain both a resole resin and a novolac resin. If the resole resin is omitted, the steps of imagewise exposure and heating are not able to provide a useful means of negative imaging since contact with an aqueous alkaline developing solution will not remove the coating from the unexposed areas and the printing plate processed in this manner is not useful. If the novolac resin is omitted, the steps of imagewise exposure and heating are again not able to provide a useful means of imaging since contact with an aqueous alkaline developing solution will remove the coating from both exposed and unexposed areas and the printing plate processed in this manner is not useful.

The third essential ingredient of the radiation-sensitive composition of this invention is a latent Bronsted acid. The term "latent Bronsted acid" refers to a precursor which forms a Bronsted acid by decomposition. The Bronsted acid is believed to catalyze the matrix-forming reaction between the resole resin and the novolac resin. Typical examples of Bronsted acids which are suitable for this purpose are trifluoromethane sulfonic acid and hexafluorophosphoric acid.

Ionic latent Bronsted acids are suitable for use in this invention. Examples of these include onium salts, in particular iodonium, sulfonium, phosphonium, selenonium, diazonium and arsonium salts. Specific examples of particularly useful onium salts include:

diphenyliodonium hexafluorophosphate, triphenylsulfonium hexafluoroantimonate, phenylmethyl-ortho-cyanobenzylsulfonium trifluoromethane sulfonate, and 2-methoxy-4-aminophenyl diazonium hexafluorophosphate Non-ionic latent Bronsted acids are also suitable for use in this invention. Examples of these include compounds of the formula:

$RCH_2X$

RCHX$_2$
RCX$_3$
R(CH$_2$X)$_2$
and
R(CH$_2$X)$_3$ wherein X is Cl, Br, F, or CF$_3$SO$_3$ and R is an aromatic group, an aliphatic group or a combination of aromatic and aliphatic groups.

Useful ionic latent Bronsted acids include those represented by the formula:

X$^+$R$_1$R$_2$R$_3$R$_4$ W$^-$

When X is iodine then R$_3$ and R$_4$ are electron lone pairs and R$_1$ and R$_2$ are aryl or substituted aryl groups. When X is S or Se then R$_4$ is an electron lone pair and R$_1$, R$_2$ and R$_3$ can be an aryl group, a substituted aryl group, an aliphatic group or a substituted aliphatic group. When X is P or As, then R$_4$ can be an aryl group, a substituted aryl group, an aliphatic group or a substituted aliphatic group. W can be BF$_4$, CF$_3$SO$_3$, SbF$_6$, CCl$_3$CO$_2$, ClO$_4$, AsF$_6$, PF$_6$, or any corresponding acid whose pH is less than three.

Any of the onium salts described in U.S. Pat. No. 4,708,925 can be utilized as the latent Bronsted acid in this invention. These include iodonium, sulfonium, phosphonium, bromonium, chloronium, oxysulfoxonium, oxysulfonium, sulfoxonium, selenonium, telluronium and arsonium salts.

Use of diazonium salts as latent Bronsted acids is particularly preferred in this invention. They provide equivalent sensitivity to other latent Bronsted acids in the infrared region and higher sensitivity in the ultraviolet region.

An additional class of useful latent Bronsted acids are the haloalkyl-substituted s-triazines. The haloalkyl-substituted s-triazines are well known photolytic acid generators. Use of these compounds for this purpose is described, for example, in U.S. Pat. No. 3,779,778.

Preferred haloalkyl-substituted s-triazines for use in this invention are compounds of the formula:

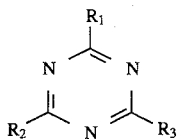

wherein R$_1$ is a substituted or unsubstituted aliphatic or aromatic radical and R$_2$ and R$_3$ are, independently, haloalkyl groups.

In the above formula, it is especially preferred that R$_2$ and R$_3$ are haloalkyl groups of 1 to 4 carbon atoms.

R$_1$ can include any substituent which does not adversely affect the photolyric acid-generating capability of the s-triazine compound. Such substituents include alkyl groups and alkoxy groups.

Particularly preferred haloalkyl-substituted s-triazines for use in this invention are compounds of the formula:

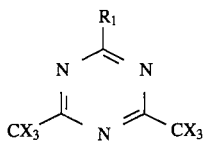

wherein R$_1$ is a substituted or unsubstituted aliphatic or aromatic radical and each X is, independently, a halogen atom.

The most preferred haloalkyl-substituted s-triazines for use in this invention are compounds of the formula:

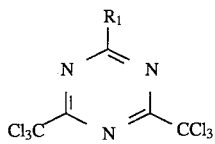

wherein R is an aryl group of 6 to 15 carbon atoms, such as, for example, phenyl or naphthyl.

Specific examples of haloalkyl-substituted s-triazines that are preferred for use in this invention include the following compounds:

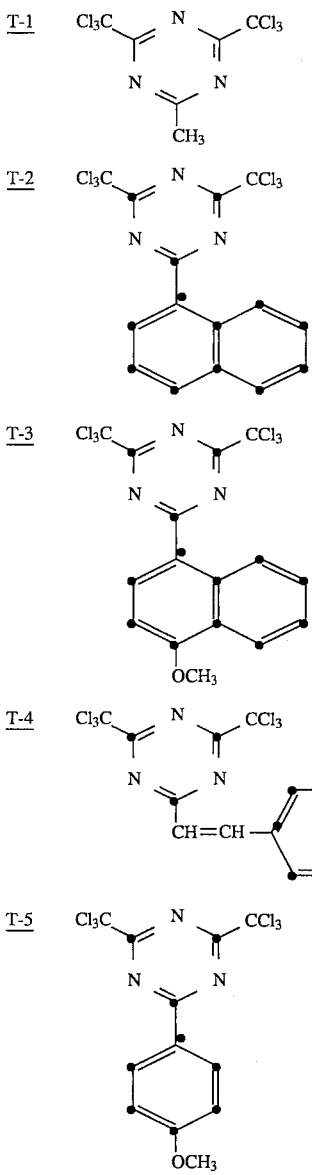

The fourth essential ingredient of the radiation-sensitive composition of this invention is an infrared absorber. The infrared absorber renders the composition sensitive to infrared radiation and makes the printing plate useful as a direct laser addressable plate which can be imaged by exposure to a laser which emits in the infrared region.

The infrared absorber can be a dye or pigment. A very wide range of such compounds is well known in the art and includes dyes or pigments of the squarylium, croconate, cyanine, merocyanine, indolizine, pyrylium and metal dithiolene classes. It is preferred that the infrared absorber fragment upon exposure to the activating radiation since the decomposition products promote increased contrast between image and non-image areas and thereby help in the development process.

Additional infrared absorbers that are of utility in this invention include those described in U.S. Pat. No. 5,166,024, issued Nov. 24, 1992. As described in the '024 patent, particularly useful infrared absorbers are phthalocyanine pigments.

An optional ingredient in the radiation-sensitive composition of this invention is the compound terephthalaldehyde. This compound has the formula:

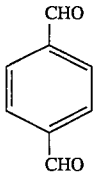

It functions as a highly effective speed-enhancing agent in the radiation-sensitive compositions of this invention.

In a particularly preferred embodiment of the invention, the radiation-sensitive composition also includes the compound 3,4,5-trimethoxybenzoic acid. This compound has the formula:

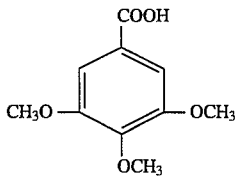

It functions to enhance the image/non-image contrast. It is believed to do this by undergoing decarboxylation in the image areas, where heat is generated, to an oleophilic material but remaining soluble in base in the non-exposed areas. The 3,4,5-trimethoxybenzoic acid can be described as an agent which promotes background release in the processing of the lithographic printing plates of this invention.

As explained hereinabove, the four essential ingredients of the radiation-sensitive composition of this invention are a resole resin, a novolac resin, a latent Bronsted acid and an infrared absorber. Other ingredients which can optionally be incorporated in the composition include colorants, stabilizers, additional sensitizers, exposure indicators and surfactants.

The thickness of the imaging layer in the printing plates utilized in this invention can vary widely. Typically, a dry thickness in the range of from about 0.5 to about 2 micrometers, more preferably from about 1 to about 1.5 micrometers is suitable.

The lithographic printing plates utilized in this invention can employ any of the supports conventionally used for lithographic printing plates, including supports formed from aluminum or other metals, supports formed from polymers such as polyesters, and supports formed from polymer-coated paper. A preferred support material is grained and anodized aluminum.

To form the printing plate, the resole resin, novolac resin, latent Bronsted acid and infrared absorber are dissolved or dispersed in a suitable solvent in appropriate proportions and coated on the support using such well-known coating techniques as spin coating or hopper coating. Preferred solvents include acetone and 1-methoxy-2-propanol. The resole resin and novolac resin are each incorporated in the coating composition in an amount of from about 1.5 to about 6 percent by weight, more preferably from about 2.5 to about 5.5 percent by weight, and most preferably from about 4.5 to about 5.3 percent by weight. When latent Bronsted acid is employed, it is incorporated in the coating composition in an amount of from about 0.3 to about 1 percent by weight, more preferably from about 0.45 to about 0.9 percent by weight, and most preferably from about 0.75 to about 0.85 percent by weight. The infrared absorber is incorporated in the coating composition in an amount of from about 0.15 to about 1.1 percent by weight, more preferably from about 0.45 to about 0.9 percent by weight, and most preferably from about 0.68 to about 0.88 percent by weight. When terephthalaldehyde is employed, it is incorporated in the coating composition in an amount of from about 0.20 to about 2 percent by weight, more preferably from about 0.4 to about 1.6 percent by weight, and most preferably from about 0.8 to about 1.2 percent by weight. In the preferred embodiment of the invention in which 3,4,5-trimethoxybenzoic acid is included, it is typically used in an amount of from about 0.25 to about 1.5 percent by weight.

Suitable conditions for drying the layer involve heating for a period of from about 0.5 to about 10 minutes at a temperature in the range of from about 20° C. to about 150° C.

As hereinabove explained, the lithographic printing plates of this invention are exposed with high-intensity laser diodes that emit in the infrared region of the spectrum. Such laser diodes provide the advantage of both low cost and low energy consumption. The lithographic printing plates can also be exposed with conventional ultraviolet radiation sources, including carbon arc lamps, mercury vapor lamps, fluorescent lamps, tungsten filament lamps and photoflood lamps.

Exposure of the printing plate results in the formation of an image which is typically visible as a reddish-yellow color on a light green background.

The high-intensity infrared laser beam utilized in this invention is capable of decomposing both the latent Bronsted acid and the infrared absorber in the exposed areas. The products from the thermal decomposition are mainly strong acids which are effective in crosslinking the resins, thereby altering solubility in aqueous alkaline developing solution.

As described hereinabove, in a negative-working process the imagewise-exposed plate is heated in a step that is referred to as a post-exposure bake or PEB. The heating step is conducted at a temperature in the range of from about 75° C. to about 150° C. for a period of from about 15 to about 300 seconds. More preferably, the heating is for a period of from about 30 to about 90 seconds at a temperature in the range of from about 90° C. to about 110° C. After the PEB is completed, the plate is then either hand processed or machine processed in an aqueous alkaline developing solution until the non-image areas are removed. This typically requires about 30 to about 120 seconds. A preferred aqueous alkaline developing solution is a silicate solution such as a six percent by weight aqueous solution of sodium metasilicate. A suitable commercially available silicate solution for this purpose is KODAK AQUA-IMAGE POSITIVE DEVELOPER MX-1589-1 which is sold by Eastman Kodak Company. After contact with the aqueous alkaline developing solution, the plate is usually treated with a finisher such as gum arabic.

The number of printing impressions obtainable is primarily dependent upon use of a post development baking step.

If no such baking step is used, the plate typically provides about 60000 to 70000 impressions, whereas post development baking for about 5 minutes at about 250° C. typically provides about 300000 to about 350000 impressions. The number of impressions that can be attained before wear is detected can also be increased by increasing the coating weight.

The invention is further illustrated by the following example of its practice.

A lithographic printing plate was prepared by coating a 140 μm thick aluminum sheet, having a grained and anodized surface, with a mixture of the following composition:

(1) 0.513 g/m² of BKS-5928 resole resin available from Georgia Pacific Corporation;

(2) 0.612 g/m² of N-9P novolac resin available from Eastman Kodak Company;

(3) 0.102 g/m² of an infrared-absorbing dye available from Eastman Kodak Company of the following structure:

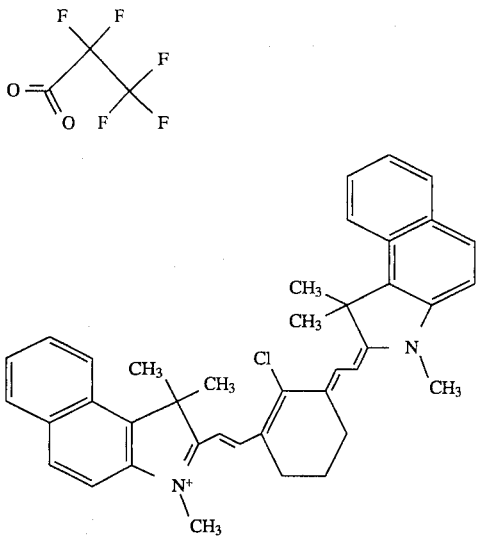

(4) 0.085 g/m² of 2-methoxy-4-aminophenyl diazonium hexafluorophosphate available from Verichem Ltd.;

(5) 0.085 g/m² of terephthalaldehyde available from Aldrich Chemicals;

(6) 0.085 g/m² of 3,4,5-trimethoxybenzoic acid available from Aldrich Chemicals;

(7) 0.013 g/m² of Victoria Blue FBO available from Aldrich Chemicals; and (8) 0.008 g/m² of DC-190 Surfactant available from Dow Corning Corporation.

The laser printing apparatus utilized to imagewise expose the printing plate comprised a 52.7 cm circumference motor-driven drum that is used to retain a plate to be exposed, a printhead incorporating a 250 mW laser diode (power measured at the drum surface) operating at 830 nm wavelength, and a motor-driven leadscrew used to linearly index the printhead. The 1/e² spot size of the laser was 300 μm², based on the measured Gaussian beam of the laser at the 1/e² point of 25×12 μm. The printing plate was loaded on the drum and exposed to a series of power steps starting at 250 mW and decreasing by 6/256 of 250 mW for each step of the series of 40 steps around the drum.

The drum was rotated at 200, 300, 400, 500 and 600 rpm, successively, and the printing plate was exposed long enough to produce several millimeters of an image at each of the specified drum speeds. After exposure, the plate was processed by baking it in an oven at 100° C. for 90 seconds. After baking, the plate was processed with standard plate processing chemicals to give the finished printing plate. The plate was then mounted on an AB Dick 360 Model 9870 press, and several hundred impressions were printed. One of these was selected and the exposure steps were measured with an X-Rite Model 408 reflection densitometer (X-Rite Corp., Grandville, Mich.). The exposure step was noted where the printed ink density was greater than 0.50. This criterion was selected because the maximum printed density was about 1.0, and at 0.50 the rate of change in density with exposure is largest (the halfway point) and therefore the easiest to measure with accuracy. The steps which just exceeded 0.50 density were tabulated in Table I below along with the calculated intensities and exposure levels of those steps.

TABLE I

| Step # at 0.5 Density | 200 RPM #30 | 300 RPM #27 | 400 RPM #24 | 500 RPM #22 | 600 RPM #21 |
|---|---|---|---|---|---|
| Laser Power | 74 mW | 92 mW | 109 mw | 121 mW | 127 mW |
| Exposure | 398 mJ/cm² | 329 mJ/cm² | 293 mJ/cm² | 260 mJ/cm² | 227 mJ/cm² |
| Intensity | .24 mW/μm² | .30 mW/μm² | .36 mW/μm² | .40 mW/μm² | .42 mW/μm² |

From Table I, the exposure step with minimum printing performance at 200 rpm was step number 30. The laser power at step number 30 is given by:

$$250(1-(6\times30)/256)=74 \text{ mW}$$

The exposure at step number 30 is given by:

$$(9450\times74)/(527\times(200/60))=398 \text{ mJ/cm}^2$$

where 9450 is the number of mm of linear writing in a cm² area of writing; 200 is the rpm of the drum, 60 is the number of seconds in a minute, 527 is the number of mm of the circumference of the drum and 74 is the number of mW of laser power at step number 30.

The laser intensity at step number 30 is given by the laser power (74 nW) divided by the area of the laser spot. The area of the laser spot was measured by a laser beam profilometer, and was 25×12 μm² at the 1/e² point. The laser intensity is thus:

$$74/(25\times12)=0.24 \text{ mW/μm}^2$$

As shown by the data in Table I, the minimum exposure needed to achieve a given level of lithographic printing performance decreases as the laser intensity increases. The present invention is not limited to a rotating drum type printer in which a laser source is linearly indexed with respect to the rotating drum, but is also applicable to printers in which the plate is scanned by rotating and indexing the laser source with respect to the plate, or printers in which the plate is exposed by scanning a laser beam from a fixed laser source by means of mirrors on galvanometers or rotating polygons.

The invention has been described in detail, with particular reference to certain preferred embodiments thereof, but it should be understood that variations and modifications can be effected within the spirit and scope of the invention.

We claim:

1. A method of imaging a lithographic printing plate; said method comprising the steps of:

(I) providing a lithographic printing plate comprising a support and an imaging layer that is sensitive to both ultraviolet and infrared radiation and capable of functioning in either a positive-working or negative-working manner; said imaging layer comprising an admixture of (1) a resole resin, (2) a novolac resin, (3) a latent Bronsted acid and (4) an infrared absorber; and (II) imagewise exposing said imaging layer with a high-intensity laser diode emitting an infrared laser beam with an intensity at the surface of said imaging layer of at least about 0.2 milliwatts per square micrometer.

2. A method as claimed in claim 1, wherein said intensity is at least about 0.4 milliwatts per square micrometer.

3. A method as claimed in claim 1, wherein said resole resin is derived from bis-phenol A and formaldehyde.

4. A method as claimed in claim 1, wherein said novolac resin is derived from m-cresol and formaldehyde.

5. A method as claimed in claim 1, wherein said latent Bronsted acid is an ionic latent Bronsted acid.

6. A method as claimed in claim 1, wherein said latent Bronsted acid is a non-ionic latent Bronsted acid.

7. A method as claimed in claim 1, wherein said latent Bronsted acid is an iodonium, sulfonium, phosphonium, selenonium, diazonium or arsonium salt.

8. A method as claimed in claim 1, wherein said latent Bronsted acid is diphenyliodonium hexafluorophosphate.

9. A method as claimed in claim 1, wherein said latent Bronsted acid is 2-methoxy-4-aminophenyl diazonium hexafluorophosphate.

10. A method as claimed in claim 1, wherein said latent Bronsted acid is a haloalkyl-substituted s-triazine.

11. A method as claimed in claim 1, wherein said latent Bronsted acid is a haloalkyl-substituted s-triazine of the formula:

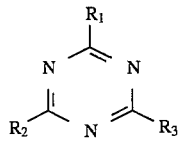

wherein $R_1$ is a substituted or unsubstituted aliphatic or aromatic radical and $R_2$ and $R_3$ are, independently, haloalkyl groups.

12. A method as claimed in claim 1, wherein said latent Bronsted acid is a haloalkyl-substituted s-triazine of the formula:

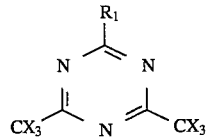

wherein $R_1$ is a substituted or unsubstituted aliphatic or aromatic radical and each X is, independently, a halogen atom.

13. A method as claimed in claim 1, wherein said latent Bronsted acid is a haloalkyl-substituted s-triazine of the formula:

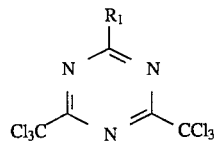

wherein R is an aryl group of 6 to 15 carbon atoms.

14. A method as claimed in claim 1, wherein said infrared absorber is a squarylium, croconate, cyanine, merocyanine, indolizine, pyrylium or metal dithiolene dye or pigment.

15. A method as claimed in claim 1, wherein said imaging layer additionally contains terephthalaldehyde.

16. A method as claimed in claim 1, wherein said imaging layer additionally contains 3,4,5-trimethoxybenzoic acid.

17. A method as claimed in claim 1, wherein said support is a polyester film.

18. A method as claimed in claim 1, wherein said support is comprised of grained and anodized aluminum.

19. A method of imaging a lithographic printing plate; said method comprising the steps of:

(I) providing a lithographic printing plate comprising a support and an imaging layer that is sensitive to both ultraviolet and infrared radiation and capable of functioning in either a positive-working or negative-working manner; said imaging layer comprising an admixture of (1) a resole resin, (2) a novolac resin, (3) a latent Bronsted acid and (4) an infrared absorber;

(II) imagewise exposing said imaging layer with a high-intensity laser diode emitting an infrared laser beam with an intensity at the surface of said imaging layer of at least about 0.2 milliwatts per square micrometer; and (III) contacting said lithographic printing plate with an aqueous alkaline developing solution to remove the exposed areas thereof and thereby form a lithographic printing surface.

20. A method of imaging a lithographic printing plate; said method comprising the steps of:

(I) providing a lithographic printing plate comprising a support and an imaging layer that is sensitive to both ultraviolet and infrared radiation and capable of functioning in either a positive-working or negative-working manner; said imaging layer comprising an admixture of (1) a resole resin, (2) a novolac resin, (3) a latent Bronsted acid and (4) an infrared absorber;

(II) imagewise exposing said imaging layer with a high-intensity laser diode emitting an infrared laser beam with an intensity at the surface of said imaging layer of at least about 0.2 milliwatts per square micrometer;

(III) heating said lithographic printing plate to provide reduced solubility in exposed areas and increased solubility in unexposed areas; and (IV) contacting said lithographic printing plate with an aqueous alkaline developing solution to remove the unexposed areas thereof and thereby form a lithographic printing surface.

* * * * *

UNITED STATES PATENT AND TRADEMARK OFFICE
CERTIFICATE OF CORRECTION

PATENT NO.   : 5,491,046
DATED        : February 13, 1996
INVENTOR(S)  : Charles D. Deboer and Neil F. Haley It is certified that error appears in the above-identified patent and that said Letters Patent is hereby corrected as shown below:

On the title page, insert Item --[*] Notice: The term of this patent shall not extend beyond the expiration date of Pat. No. 5,372,915 and 5,340,699.--

Signed and Sealed this

Eighth Day of September, 1998

Attest:

BRUCE LEHMAN

Attesting Officer

Commissioner of Patents and Trademarks